United States Patent [19]

Takano

[11] Patent Number: 4,627,100
[45] Date of Patent: Dec. 2, 1986

[54] WIDE BAND RADIO RECEIVER

[75] Inventor: Shigeru Takano, Tokyo, Japan

[73] Assignee: Regency Electronics, Inc., Indianapolis, Ind.

[21] Appl. No.: 687,191

[22] Filed: Dec. 28, 1984

[51] Int. Cl.$^4$ .................... H03J 7/18; H04B 1/26
[52] U.S. Cl. .................... 455/160; 455/165; 455/183; 455/207; 455/315
[58] Field of Search ............ 455/160, 165, 168, 183, 455/189, 207, 209, 315, 316

[56] References Cited

U.S. PATENT DOCUMENTS

| | | | |
|---|---|---|---|
| 3,614,627 | 10/1971 | Runyan | 455/207 |
| 3,939,429 | 2/1976 | Lohn et al. | |
| 3,942,121 | 3/1976 | Bell et al. | 455/160 |
| 4,011,515 | 3/1977 | Hanson | |
| 4,135,158 | 1/1979 | Parmet | |
| 4,162,452 | 7/1979 | Ash | 455/315 |
| 4,222,121 | 9/1980 | Matsumoto et al. | 455/164 |
| 4,249,138 | 2/1981 | Bell | 455/76 |
| 4,315,333 | 2/1982 | Yamashita et al. | 455/189 |
| 4,340,975 | 7/1982 | Onishi et al. | 455/315 |
| 4,352,208 | 9/1982 | Schroeder | 455/266 |
| 4,353,132 | 10/1982 | Saitoh et al. | 455/315 |
| 4,367,558 | 1/1983 | Gercekci et al. | 455/164 |
| 4,395,777 | 7/1983 | Oki et al. | 455/183 |
| 4,545,072 | 10/1985 | Skutta et al. | 455/315 |

OTHER PUBLICATIONS

"A Portable All-Band Radio Receiver Using Microcomputer Controlled PLL Synthesizer", by Fukui et al, 8/1980.

Primary Examiner—Jin F. NG
Attorney, Agent, or Firm—Woodard, Weikart, Emhardt & Naughton

[57] ABSTRACT

A circuit arrangement for a wide band superheterodyne radio receiver for receiving wide band FM, narrow band FM, and AM modulated radio signals between 25 and 550 MHz. The first LO is a phase locked loop controlled VCO, with central processing unit control of the phase locked loop circuitry. The first IF frequency is higher than the highest received frequency and the output frequency of the first LO is higher than the first IF. A second LO and second mixer convert the signal to a second IF lower than the first IF. Separate third and fourth IF band pass filters are provided at the second IF for WFM and for NFM/AM, respectively. The output of the third IF filter (WFM) is converted by a third LO and third mixer to a third IF lower than the second IF. A WFM demodulator is provided at the third IF. The output of the fourth IF filter (NFM/AM) is converted by a fourth LO and fourth mixer to a fourth IF lower than the second IF frequency. A fifth IF band pass filter is provided at the fourth IF. The output of the fifth IF filter is received be separate NFM and AM demodulators. Each demodulator is followed by its own audio amplifier, each selectively connectable to a speaker.

6 Claims, 2 Drawing Figures

WIDE BAND RADIO RECEIVER

BACKGROUND OF THE INVENTION

1. Field of the Invention

This invention relates generally to radio receivers and in particular to a wide band synthesized general coverage scanning receiver for receiving frequencies in the range of 25 to 550 Mhz.

2. Description of the Related Art

In recent years scanning radio receivers have become quite popular for monitoring local VHF and UHF radio transmissions such a those of police and other local authorities, as well as amateur and commercial stations. Such receivers have typically been limited in receiving capability to a relatively narrow band of frequencies, or sometimes a few different bands, with gaps in coverage between the bands. Such receivers also are frequently restricted to demodulating only one type of modulation, usually FM.

One embodiment of the present invention is a receiver which covers the entire spectrum from 25 to 550 MHz and can receive WFM, NFM and AM.

SUMMARY OF THE INVENTION

One embodiment of a circuit arrangement for a wide band superheterodyne radio receiver for receiving incoming radio signals between about 25 MHz and 550 MHz might involve a variable first local oscillator, a first mixer responsive to the incoming radio signals and to the output signal of the first local oscillator for converting the incoming radio signals to a first intermediate frequency which is higher than the upper frequency limit of the incoming radio signals and which is higher than about 550 MHz. Further included is a first intermediate band pass frequency filter circuit selectively responsive to the first intermediate frequency, a second local oscillator, and a second mixer responsive to the output signal of the first intermediate frequency filter circuit and to the output signal of the second local oscillator for converting the output signal of the first intermediate frequency filter circuit to a second intermediate frequency signal which is lower in frequency than the first intermediate frequency signal. Also provided is a phase locked loop circuitry means for controlling the frequency of the first local oscillator, and a controller means responsive to externally manipulable switches for controlling the phase locked loop circuitry means to provide manual frequency tuning and automatic frequency scanning of the incoming radio signals.

It is an object of the present invention to provide an improved wide band radio receiver.

Further objects and advantages will be apparent from the description which follows.

BRIEF DESCRIPTION OF THE DRAWINGS

FIGS. 1 and 2 together illustrate the entire block diagram when layered side by side.

DESCRIPTION OF THE PREFERRED EMBODIMENT

Figure 1:
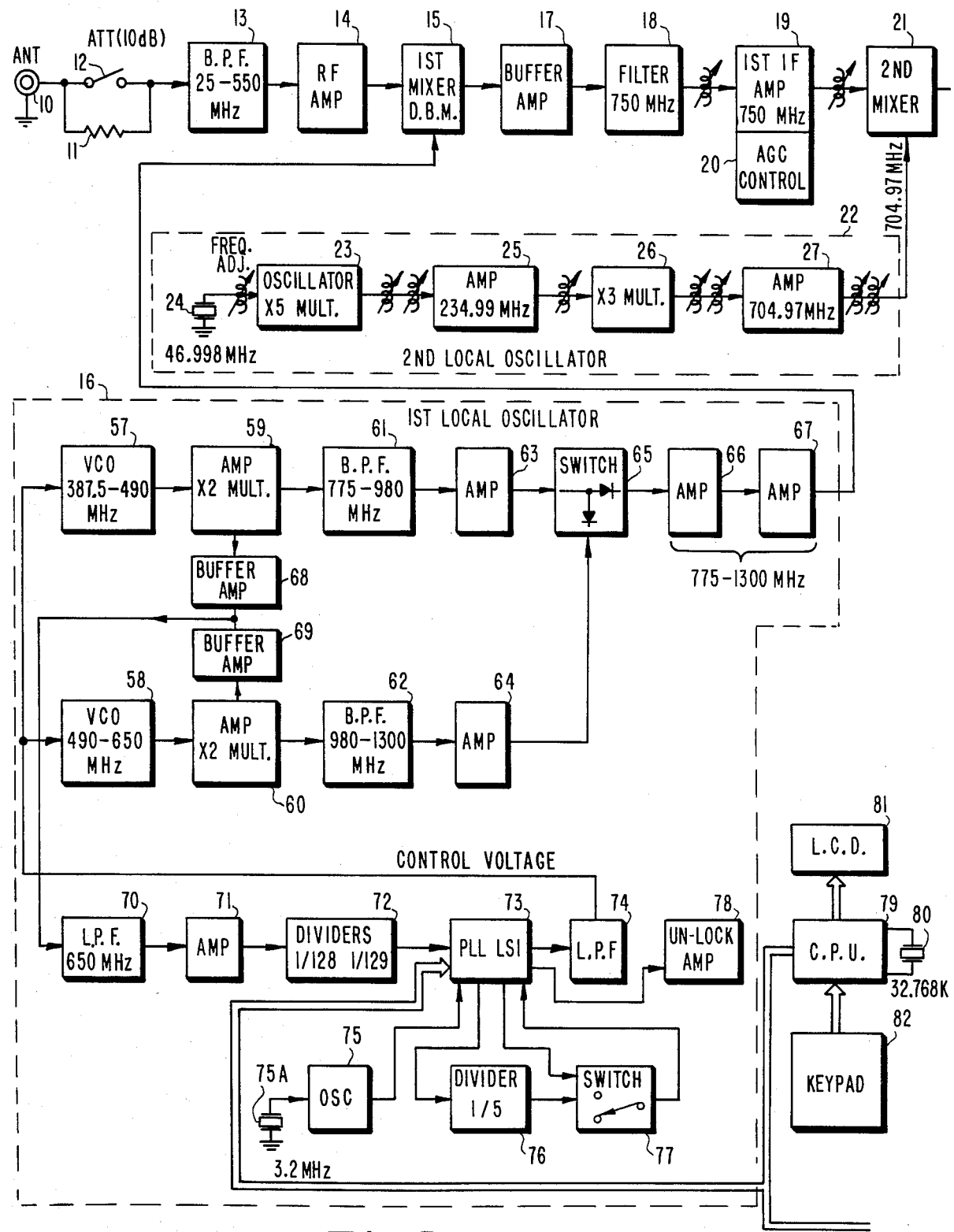
FIG. 1 is the left half of a block diagram of the circuit of the present invention.
Figure 2:
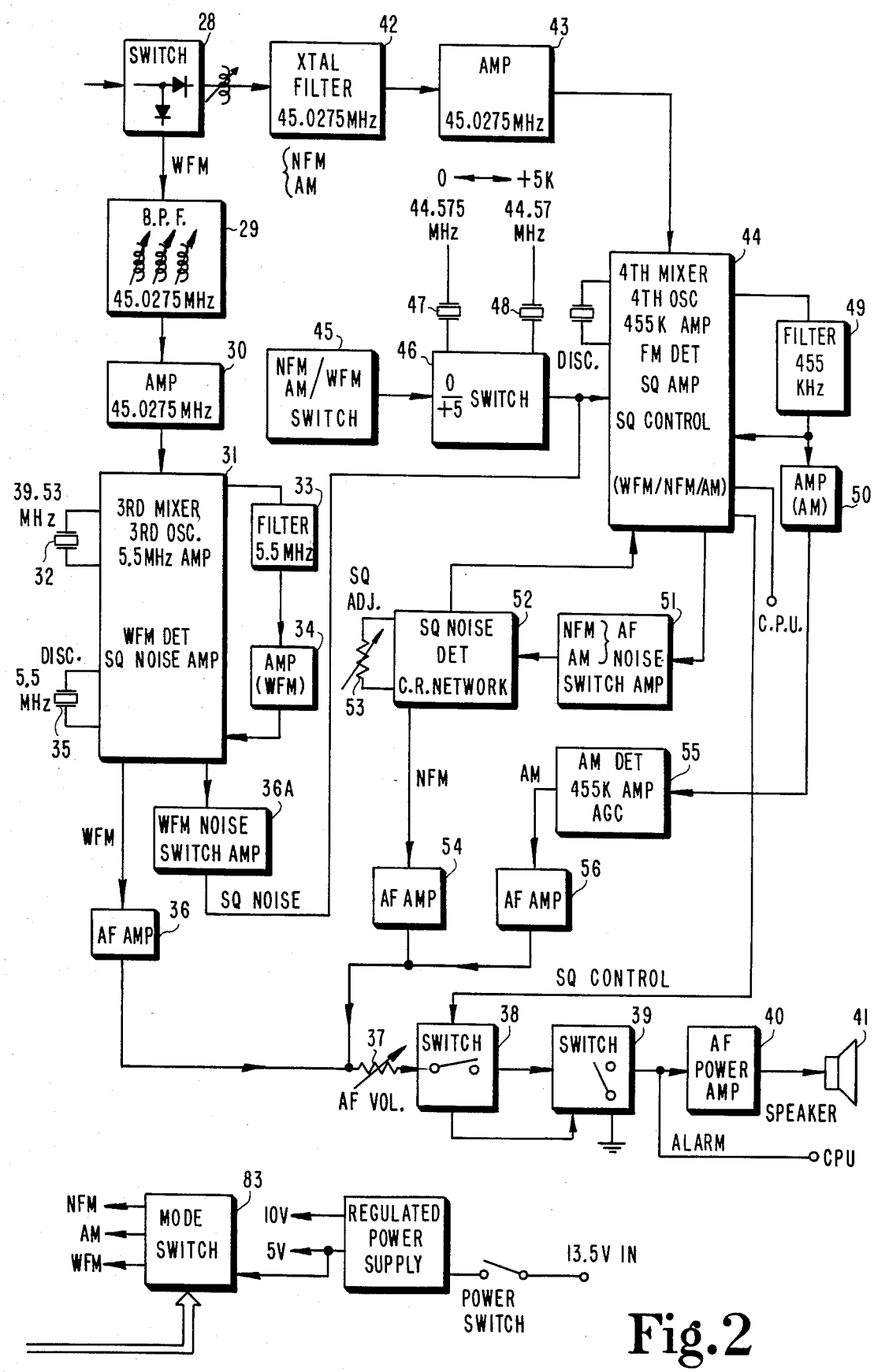
FIG. 2 is the right half of a block diagram of the circuit of the present invention.

In FIGS. 1 and 2, there is illustrated a block diagram of the preferred embodiment of a radio receiver circuit in accordance with the present invention. The block diagram is divided between FIGS. 1 and 2 for ease of illustration. FIGS. 1 and 2 should be placed side by side to view the entire diagram, with FIG. 1 on the left.

Referring in particular to FIG. 1, an incoming radio frequency signal in the range of 25 to 550 MHz presented at antenna connector 10 can be selectively directed through or around a 10 dB signal attenuator 11 by means of switch 12. Thereafter, the radio signal passes through an LC type band-pass filter 13 having a pass band of 25 to 550 MHz. The filtered radio signal is then amplified by RF amp 14 which is an MC-5800 type IC amplifier. The amplified radio signal passes to the input port of first mixer 15 which is a 487C1-3R type double balanced diode ring mixer. In first mixer 15, the radio signal is mixed with an rf signal from first local oscillator 16, which rf signal is variable from 775 to 1300 MHz. Thus, this receiver circuit uses high side injection at the first mixer to convert the incoming received radio signal to a first intermediate frequency signal of 750 MHz. By employing a first IF frequency higher than the upper frequency limit of the desired reception band, it is assured that all image frequencies will fall well outside the pass band of band-pass filter 13.

The output signal from first mixer 15 is amplified by buffer amp 17 which is a single stage bipolar transistor type 2SC 3355. The buffered IF signal then passes through a DFC2R750P type ceramic filter 18 centered about 750 MHz. Filter 18 provides initial selectivity of the receiver and reduces noise to following stages. After filtering, the first IF signal then passes to the first IF amplifier 19 which is a 3SK121 type dual gate MOSFET transistor. Automatic gain control of IF amplifier 19 is provided by AGC control 20.

A second conversion of the signal from the first IF frequency of 750 MHz to a second intermediate frequency signal of 45.0275 MHz is accomplished by second mixer 21, which is a 2SC3355 type bipolar transistor. The first IF signal is mixed in second mixer 21 with an rf signal of 704.97 MHz from second local oscillator 22. The output signal of second LO 22 is generated by oscillator-multiplier 23 which is a 2SC2786 type bipolar transistor crystal oscillator controlled by a 46.998 MHz quartz crystal 24 and configured as a five-times frequency multiplier. The 234.99 MHz output signal from oscillator-multiplier 23 is amplified by amplifier 25, a 2SC2786 type transistor, and then tripled in frequency to 704.97 MHz by amplifier-multiplier 26, which is a 2SC3355 type transistor. Finally, the 704.97 MHz signal is amplified by an additional 2SC3355 transistor amplifier and injected into second mixer 21.

Referring in particular to FIG. 2, the output signal from second mixer 21 can be selectively directed along two alternate pathways by diode switch 28, depending upon whether it is desired to received wide band FM (WFM) modulated signals, or alternatively, narrow band FM (NFM) or AM modulated siginals.

If WFM reception is selected, the output signal from second mixer 21 is directed by switch 28 to an LC type band-pass filter 29 centered about 45.0275 MHz. After passing through filter 29, the signal is amplified by a two stage 2SC2787 type transistor second IF amplifier 30. The WFM modulated signal then passes to an MC-3357P type integrated circuit 31 which is a one-package combination of a third mixer, a third local oscillator, a 5.5 MHz third IF amp, a WFM detector and squelch noise amplifier. IC 31 has certain associated external components including a 39.53 MHz quartz crystal 32 for controlling the frequency of the third local oscillator portion IC 31. Also included is an external 5.5 MHz ceramic filter 33 and 2SC2787 type transistor amplifier 34. A 5.5 MHz discriminator crystal 35 in combination with IC 31 provides FM detection. The demodulated WFM signal is outputted from IC 31 as audio frequency signals which are fed to audio frequency preamp 36, through volume control 37, switches 38 and 39, and to audio power amplifier 40. The output of power amp 40 is audibly reproduced by speaker 41. A squelch noise output from IC 31 is amplified by WFM noise switch amp 36A and is inputted to IC 44, described below, for squelch control.

If narrow band FM or AM reception is selected, the output signal from second mixer 21 is directed by switch 28 to monolithic quartz crystal band-pass filter 42, which provides the narrower bandwidth required by NFM and AM as compared to the wider bandwidth provided by filter 29 for WFM reception. Filter 42 is centered about 45.0275 MHz, as is filter 29, previously discussed. The output from filter 42 is amplified by amplifier stage 43 which is substantially identical to amplifier stage 30. After amplification, the second IF signal from amplifier 43 passes to integrated circuit 44 which is an MC-3357P type IC identical to IC 31, except it is configured with different external components for operation at a third intermediate frequency of 455 kHz rather than 5.5 MHz as used for WFM reception. IC 44 is also provided with switchable crystals for determining the frequency of operation of the third local oscillator portion of IC 44. By means of diode switching provided by switching circuits 45 and 46, 44.575 MHz crystal 47 and 44.570 MHz crystal 48 can be alternately connected to IC 44. Inasmuch as the second IF frequency signal is at 45.0275 MHz, after mixing in the third mixer portion of IC 44, the signal will have been converted to a third intermediate frequency of either 452.5 KHz or 457.5 KHz, depending upon whether crystal 47 or 48 is selected. Since the third IF selectivity is provided by ceramic filter 49 centered about 455 kHz, it is apparent that the third IF frequency signal will not be centered within the pass band of filter 49, but rather will be closer to one skirt or the other. This provides a pass band shifting capability which is particularly useful where an interfering signal is close to the desired signal. By shifting the pass band in the appropriate direction, the adjacent interfering signal can often be shifted outside the pass band while the desired signal remains within it.

Associated with IC 44 are switch amp 51 and a NS-110A type IC squelch noise detector 52. A squelch adjust potentiometer 53 is also provided in association with IC 52. The demodulated NFM signal is outputted from IC 52 as audio frequency signals which are fed to audio frequency preamp 54 and on to speaker 41 as previously described.

Where it is desired to receive AM signals, the third IF frequency signal from filter 49 is amplified by amplifier 50 and passed to NIS-112 type integrated circuit 55 which provides 455 kHz IF amplification, AM detection, and AGC action. The demodulated AM signal is outputted from IC 55 as audio frequency signals which are fed to audio frequency preamp 56 and on to speaker 41 as previously described.

Referring again to FIG. 1, the first local oscillator 16 referred to above is briefly described. Included are dual voltage controlled oscillator integrated circuits 57 and 58, which are NIS-118 and NIS-119 types respectively. VCO 57 is configured to produce an output frequency signal variable between 387.5 MHz and 490 MHz in response to applied control voltage. VCO 58 is configured to produce an output frequency signal variable between 490 MHz and 650 MHz in response to applied control voltage. The output frequency of each VCO 57 and 58 is doubled by amplifier-multipliers 59 and 60, each of which is a 2SC3355 type bipolar transistor. After doubling, the VCO signals are passed through band pass filters 61 and 62, with filter 61 having a pass band of 775 MHz to 980 MHz and filter 62 having a pass band of 980 MHz to 1300 MHz. Filter 61 is an NIS-116 type IC and filter 62 is an NIS-117 type IC. Next the VCO signals are amplified by 2SC3355 type transistor amplifiers 63 and 64 and then pass to diode switch 65 which provides for selective switching between the outputs of the two VCO's, depending upon which range of frequencies is required for tuning the received radio signal. Switch 65 is followed by a two stage 2SC3355 type transistor amplifier 66 and 67 configured to operate over the frequency range from 775 to 1300 MHz. The output frequency signal from amplifier 67 is fed to first mixer 15 as previously described.

Control of the frequency of operation of VCO's 57 and 58 is provided by phase locked loop circuitry which is referenced to a 3.2 MHz crystal controlled oscillator for frequency stability. A portion of the amplified output signal of each VCO is directed through buffer amplifiers 68 and 69 through a low pass filter 70 which is an NIS-115 type IC filter configured to pass signals below 650 MHz. This signal is then amplified 71 by a uPC1651G type amplifier and fed to a uP5563 type divider 72 which provides 1/128 and 1/129 division of the signal frequency. The divided signal passes to a large scale integrated circuit phase locked loop chip 73 containing phase detector circuitry and which provides a DC output control voltage which is filtered by low pass filter 74 and fed back to VCO's 57 and 58 to maintain their operating frequency at the proper frequency as programmed by PLL 73 in cooperation with dividers 72. Oscillator 75 and 3.2 MHz crystal 75A provide a stable reference frequency for PLL 73. Also associated with PLL 73 are TC40118P type divider 76, TC5026 type switch 77, and un-lock amp 78.

Control of the phase locked loop circuitry is provided by a uPD3805-3 type central processing unit integrated circuit 79 with its clock frequency controlled by a 32.768 kHz crystal 80. Display of the received frequency and mode information are displayed by liquid crystal display 81. C.P.U. 79 is accessible from keypad 82 which allows various functions to be requested, such as automatic scan, lockout, priority, clock, search, manual up and down tuning, as well as direct entry of the desired frequency via decimal pushbuttons. C.P.U. 79 in cooperation with the squelch circuitry provides scanning of the frequency range of the receiver in discrete steps until a carrier frequency is received. C.P.U. 79 also controls mode switch 83 (FIG. 2) for activating and inactivating appropriate portions of the receiver circuit depending upon which mode (WFM, NFM or AM) is desired to be received.

Throughout the block diagram there are shown several symbols such as appear between filter 18 and first IF amp 19, all of which represent appropriately tuned LC circuits.

A receiver embodying the above described circuitry is available for purchase from Regency Electronics, Inc., 7707 Records Street, Indianapolis, Ind., under the model number MX5000.

While the preferred embodiment of the invention has been illustrated and described in some detail in the drawings and foregoing description, it is to be understood that this description is made only by way of example to set forth the best mode contemplated of carrying out the invention and not as a limitation to the scope of the invention which is pointed out in the claims below.

What is claimed is:

1. A superheterodyne radio receiver, comprising:
   a synthesized first local oscillator for producing a signal having a frequency which is variable between about 775 MHz to about 1300 MHz, said first local oscillator being varactor tuned;
   phase locked loop circuitry means for controlling the frequency of the signal produced by said synthesized first local oscillator;
   central processing computer means for controlling said phase locked loop circuitry in response to data entered from manually operable keypad switches;
   a first mixer circuit for converting an incoming received signal having a frequency within the band of about 25 to about 550 MHz to a first intermediate frequency signal of about 750 MHz by mixing said incoming received signal with the signal from said first local oscillator;
   a filter circuit centered about 750 MHz for selectively receiving said first intermediate frequency signal;
   a second local oscillator for producing a signal having a frequency of about 704.97 MHz;
   a second mixer circuit for converting said filtered first intermediate frequency signal to a second intermediate frequency signal of about 45.0275 MHz by mixing said filtered first intermediate frequency signal with the signal from said second local oscillator;
   a wide band FM filter circuit centered about 45.0275 MHz for selectively receiving said second intermediate frequency signal;
   a third local oscillator for producing a signal having a frequency of about 39.53 MHz;
   a third mixing circuit for converting said filtered second intermediate frequency signal to a third intermediate frequency signal of about 5.5 MHz by mixing said filtered second intermediate frequency signal with the signal from said third local oscillator;
   a filter circuit centered about 5.5 MHz for selectively receiving said third intermediate frequency signal;
   wide band FM detector means for receiving said filtered third intermediate frequency signal and detecting wide band FM audio modulation thereof, and outputing the detected modulation as an audio frequency signal;
   a narrow band FM and AM crystal filter circuit centered about 45.0275 MHz for selectively receiving said second intermediate frequency signal;
   a fourth local oscillator for producing a signal having a frequency selectively switchable between about 44.575 MHz and about 44.570 MHz;
   a fourth mixing circuit for converting said crystal filtered second intermediate frequency signal to a fourth intermediate frequency signal of about 452.5 kHz to about 457.5 kHz by mixing said crystal filtered second intermediate frequency signal with the signal from said fourth local oscillator;
   a filter circuit centered about 455 kHz for selectively receiving said fourth intermediate frequency signal;
   narrow band FM detector means for receiving said filtered fourth intermediate frequency signal and detecting narrow band FM audio modulation thereof, and outputting the detected modulation as an audio frequency signal;
   AM detector means for receiving said filtered fourth intermediate frequency signal and detecting AM audio modulation thereof, and outputting the detected modulation as an audio frequency signal;
   first mode switching means for selectively directing said second intermediate frequency signal to:
   (a) said wide band FM filter circuit, or
   (b) said narrow band FM and AM crystal filter circuit;
   second mode switching means for selectively rendering inoperable any two of said wide band FM detector means, said narrow band FM detector means, and said AM detector means;
   pass-band-shift switching means for selectively switching the frequency produced by said fourth local oscillator;
   an audio amplifier for receiving and amplifying the output audio frequency signal from said wide band FM detector;
   an audio amplifier for receiving and amplifying the output audio frequency signal from said narrow band FM detector;
   an audio amplifier for receiving and amplifying the output audio frequency signal from said AM detector; and
   a speaker selectively connectable to any one of said audio amplifiers for audibly reproducing the audio frequency signal therefrom.

2. A circuit arrangement for a wide band superheterodyne radio receiver for receiving incoming radio signals between about 25 MHz and 550 MHz, comprising:
   a variable first local oscillator for producing an output signal having a variable frequency higher than the upper frequency limit of said incoming radio signals;
   a first mixer resonsive to said incoming radio signals and to the output signal of said first local oscillator for converting said incoming radio signals to a first intermediate frequency which is higher than the upper frequency limit of said incoming radio signals and which is higher than about 550 MHz;
   a first intermediate frequency bandpass filter circuit selectively responsive to said first intermediate frequency;
   a second local oscillator;
   a second mixer responsive to the output signal of said first intermediate frequency filter circuit and to the output signal of said second local oscillator for converting the output signal of said first intermediate frequency filter circuit to a second intermediate frequency signal which is lower in frequency than said first intermediate frequency signal;
   a second intermediate frequency band pass filter circuit selectively responsive to said second intermediate frequency signal;
   a third local oscillator;
   a third mixer responsive to the output signal of said second intermediate frequency filter circuit and to the output signal of said third local oscillator for converting the output signal of said second intermediate frequency filter circuit to a third intermediate frequency signal which is lower in frequency than said second intermediate frequency signal;

a third intermediate frequency band pass filter circuit selectively responsive to said third intermediate frequency signal;

first FM demodulator means for receiving the output signal of said third intermediate frequency filter circuit and demodulating FM audio modulation thereof, and outputting the demodulated signal as an audio frequency signal;

a fourth intermediate frequency band pass filter circuit selectively responsive to said second intermediate frequency signal and having a bandwidth narrower than the bandwidth of said second intermediate band pass filter circuit;

a fourth local oscillator;

a fourth mixer responsive to the output signal of said fourth intermediate frequency filter circuit and to the output signal of said local oscillator for converting the output signal of said fourth intermediate frequency filter circuit to a fourth intermediate frequency signal which is lower in frequency than said second intermediate frequency signal;

a fifth intermediate frequency band pass filter circuit selectively responsive to said fourth intermediate frequency signal;

second FM demodulator means for receiving the output signal of said fifth intermediate frequency filter circuit and demodulating FM audio modulation thereof, and outputting the demodulated signal as an audio frequency signal; and phase locked loop circuitry means for controlling the frequency of said first local oscillator; and controller means responsive to externally manipulable switches for controlling said phase locked loop circuitry means to provide manual frequency tuning and automatic frequency scanning of said incoming radio signals.

3. The circuit arrangement of claim 2, and further including:

AM demodulator means for receiving the output signal of said fifth intermediate frequency filter circuit and demodulating AM audio modulation thereof, and outputting the demodulated signal as an audio frequency signal.

4. The circuit arrangement of claim 3, and further including:

first mode switching means for selectively directing said second intermediate frequency signal to:
(a) said third intermediate frequency band pass filter circuit, or
(b) said fourth intermediate frequency band pass filter circuit.

5. The circuit arrangement of claim 4, and further including:

second mode switching means for selectively rendering inoperable any two of said first FM demodulator means, said second FM demodulator means, and said AM demodulator means.

6. The circuit arrangement of claim 5, and further including:

pass-band-shift switching means for selectively switching the frequency produced by said fourth local oscillator.

* * * * *